United States Patent
Billenstein et al.

[11] Patent Number: 6,038,139
[45] Date of Patent: Mar. 14, 2000

[54] MOUNTING RACK FOR PLUG-IN ELECTRICAL PRINTED CIRCUIT BOARD ASSEMBLIES HAVING MEANS FOR DAMPED DISSIPATION OF ELECTROSTATIC POTENTIALS

[75] Inventors: Ernst Billenstein, Burgbernheim; Werner Körber, Betzenstein; Siegfried Kurrer, Nuernberg; Kurt-Michael Schaffer, Eckental, all of Germany

[73] Assignee: Siemens Aktiengesellschaft, Munich, Germany

[21] Appl. No.: 09/215,272

[22] Filed: Dec. 18, 1998

Related U.S. Application Data

[63] Continuation of application No. PCT/DE97/01234, Jun. 17, 1997.

[30] Foreign Application Priority Data

Jun. 18, 1996 [DE] Germany ............ 296 01 694 U

[51] Int. Cl.⁷ .................................................. H05K 7/14
[52] U.S. Cl. .................... 361/799; 361/212; 361/753; 361/796; 439/92; 174/51
[58] Field of Search ...................... 361/212, 752, 361/753, 796, 797, 799, 800, 801, 802, 818; 439/59, 62, 88, 92, 108; 174/51; 211/41.17; 206/706, 719

[56] References Cited

U.S. PATENT DOCUMENTS 4,791,524  12/1988  Teigen et al. ............................ 361/212

FOREIGN PATENT DOCUMENTS

| | | |
|---|---|---|
| 0 372 244 | 6/1990 | European Pat. Off. . |
| 324883 | 9/1920 | Germany . |
| 1 268 238 | 5/1968 | Germany . |
| 1 802 589 | 5/1969 | Germany . |
| 1 790 191 | 12/1971 | Germany . |
| 27 43 194 A1 | 4/1979 | Germany . |
| 32 00 646 C2 | 8/1982 | Germany . |
| 36 24 883 A1 | 1/1988 | Germany . |
| 40 15 061 A1 | 11/1990 | Germany . |
| 41 10 800 C1 | 7/1992 | Germany . |
| 91 14 287 U1 | 4/1993 | Germany . |
| 93 01 528 U1 | 5/1993 | Germany . |
| 295 03 735 U1 | 8/1995 | Germany . |
| 296 02 426 U1 | 5/1996 | Germany . |
| 90/03101 | 3/1990 | WIPO . |
| 95/10932 | 4/1995 | WIPO . |

OTHER PUBLICATIONS

CECC 00015 (Issue 1) (adopted as British/European Standard BS EN 100015–1), "Basic Specification; Protection of Electrostatic Sensitive Devices", paragraph 2.3.4; 1992, 1 pg.

Primary Examiner—Leo P. Picard
Assistant Examiner—Jayprakash N. Gandhi
Attorney, Agent, or Firm—Sughrue, Mion, Zinn, Macpeak & Seas, PLLC

[57] ABSTRACT

The mounting rack (BGT) has plug-in printed circuit board assemblies (BG) with an electrical resistor (R) between the front panel (FP) and the sliding contact (K). Any electrostatic charge applied to the front panel (FP) is damped by the electrical resistor (R) before being dissipated to the mounting rack BGT. The novel mounting rack (BGT) has the advantage that an assembly (BG) can be inserted and withdrawn even while the other assemblies in the mounting rack (BGT) are in operation, without any interference signals that could adversely affect operation of the other assemblies in the mounting rack (BGT) being emitted.

8 Claims, 3 Drawing Sheets

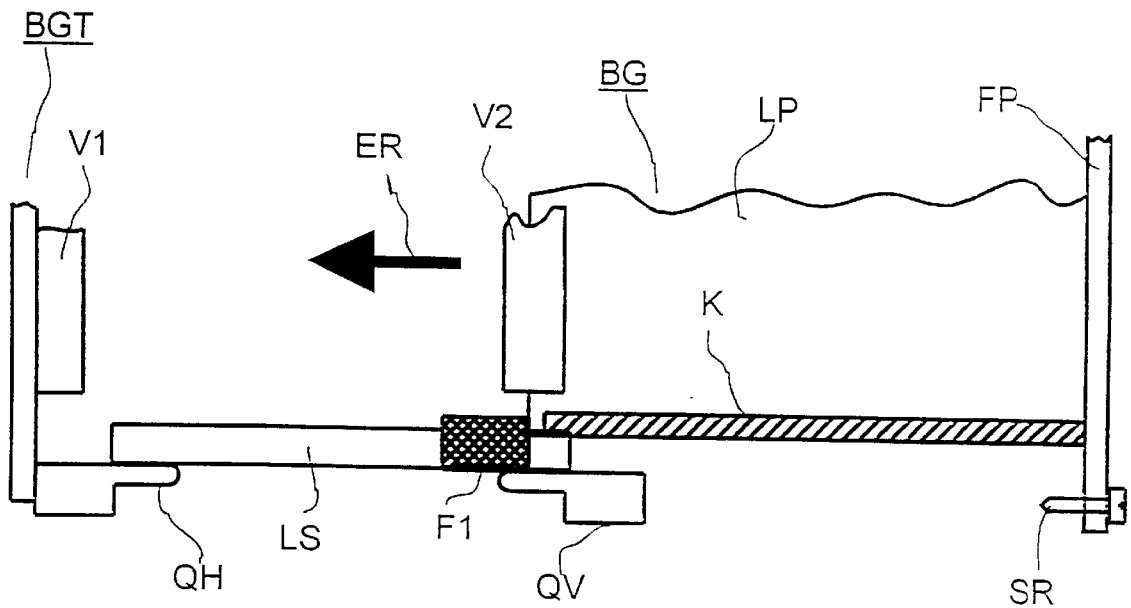
Fig. 1a CONVENTIONAL
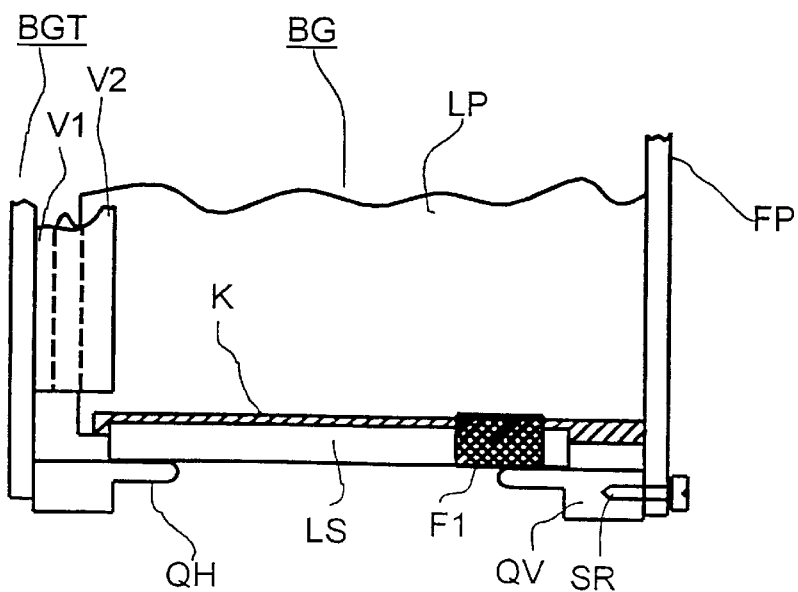
Fig. 1b CONVENTIONAL

MOUNTING RACK FOR PLUG-IN ELECTRICAL PRINTED CIRCUIT BOARD ASSEMBLIES HAVING MEANS FOR DAMPED DISSIPATION OF ELECTROSTATIC POTENTIALS

This is a Continuation of International Application PCT/DE97/01234, with an international filing date of Jun. 17, 1997, the disclosure of which is incorporated into this application by reference.

FIELD OF AND BACKGROUND OF THE INVENTION

The invention relates to new and useful improvements to a mounting rack for plug-in electrical printed circuit board assemblies. More particularly, the invention relates to a mounting rack for such assemblies having means for damped dissipation of electrostatic potentials.

When an electrical printed circuit board assembly is inserted into a mounting rack, external electrostatic voltages and static voltages can cause interference inside the mounting rack, and particularly to any other printed circuit board assemblies that have already been inserted. This causes an electrostatic voltage to be transferred during the insertion operation, in particular from a person holding the printed circuit board assembly to, at first, an electrically conductive front panel of the printed circuit board assembly to be inserted, especially if the front panel is metallic. The electrostatic voltages are often very high, leading to voltage discharges, such as spark discharges producing high frequency signals, or rapid rises in potential, which cause interference to electrical components on this printed circuit board assembly or to adjacent printed circuit board assemblies. This is particularly problematic where printed circuit board assemblies have to be inserted and withdrawn while other printed circuit board assemblies in the mounting rack are still operating. Insertion and withdrawal of a printed circuit board assembly during operation of the other printed circuit board assemblies is called "live insertion".

FIG. 1a shows a sectional detail of the lower region of a conventional mounting rack BGT in a side view. This figure further shows, by way of example, a section from an electrical printed circuit board assembly BG. This assembly BG has at least one printed circuit board LP with an electrically conductive front panel FP, particularly a metallic front panel, and has a connector V2 at the rear. In addition, there is a strip sliding contact K provided along the lower edge of the printed circuit board LP. This sliding contact K is conductively connected to the front panel FP of the printed circuit board assembly BG. The mounting rack BGT has at least one lower guide rail LS to assist in the insertion of the printed circuit board assembly BG in the direction ER, the guide rail being fitted between front and rear transverse rails QV, QH. At least one contact spring element F1 is provided in the front region inside the mounting rack BGT, and is electrically connected to the rack, preferably via the front transverse rail QV arranged underneath. It is advantageous for the contact spring element to be integrated in the guide rail LS. German Patent Specification DE 3 24 883 C2 describes one possible version of such an integration. When inserting the printed circuit board assembly BG, the contact spring element F1 first makes contact with the sliding contact K, producing an electrical connection between the front panel FP and the mounting rack BGT, which is normally grounded.

One disadvantage, however, is that external electrostatic voltages on the front panel FP can produce a spark inside the mounting rack BGT when contact is made between the sliding contact K and the contact spring element F1 while the printed circuit board assembly BG is being inserted into the mounting rack BGT. Such sparks produce high-frequency interference affecting, for example, operation of adjacent printed circuit board assemblies already in the mounting rack BGT.

FIG. 1b shows the same mounting rack BGT as that in FIG. 1a, but with the printed circuit board assembly BG inserted. The connector V2 at the rear of the printed circuit board assembly BG is now mated with a corresponding connector V1, the connector V1 preferably being fitted on a motherboard inside the mounting rack. External potentials applied to the front panel FP, for example electrostatic voltages from touching, flow via the sliding contact K, the contact spring element F1 and the transverse rail QV to the mounting rack BGT, which is normally grounded. However, the strip sliding contact K may act like an antenna, emitting interference deeply into the interior of the mounting rack BGT, thus once again interfering with the operation of printed circuit board assemblies that are already in the mounting rack BGT.

Finally, at least one contact screw SR is normally fitted at the bottom of the front panel FP. Once the printed circuit board assembly BG has been completely inserted, this contact screw SR is screwed, for example, to the lower transverse rail QV, thereby acting as a protective contact with an adequate current carrying capacity.

OBJECTS OF THE INVENTION

One object of the invention is therefore to dissipate electrostatic charges from printed circuit board assemblies to the mounting rack, thus ensuring that other printed circuit board assemblies already in the mounting rack can operate without interference.

SUMMARY OF THE INVENTION

This and other objects are achieved by the teaching of the independent claims. Particularly advantageous refinements of the invention are the subject matter of the dependent claims.

One advantage of the novel mounting rack is that electrostatic charges applied to the front panel can be dissipated to the mounting rack by being passed through an electrical resistor, with a defined time constant, thus damping them rather than creating a short. As in the case of a resistor/capacitor circuit, electrical charges are dissipated from the front panel and damped via the resistor with the printed circuit board assembly acting like a capacitor. The invention thus prevents sparking between the sliding contact and the contact spring assembly while the printed circuit board assembly is being inserted into the mounting rack. There is therefore no need to worry about interference caused by flashovers in the mounting rack.

A preferred embodiment provides a further advantage, by having additional spring elements inside the mounting rack. According to the invention, this means that a sliding contact on the printed circuit board assembly can also make contact with the mounting rack at the rear. The possible "antenna effect" of the sliding contact is thus negated even if interference acts on the front panel after the printed circuit board assembly has been inserted.

BRIEF DESCRIPTION OF THE DRAWINGS

The invention and further advantageous refinements of the invention according to the features of the dependent claims are explained in more detail below with the aid of diagrammatic, exemplary embodiments in the drawing, in which:

FIG 1a shows, by way of example, a partial side view of a conventional mounting rack, of the type already explained, FIG 1b shows, by way of example, the side view of the conventional mounting rack from FIG. 1a, as has already been explained, with a printed circuit board assembly completely inserted.

DETAILED DESCRIPTION OF THE PREFERRED EMBODIMENTS

Figure 2A:
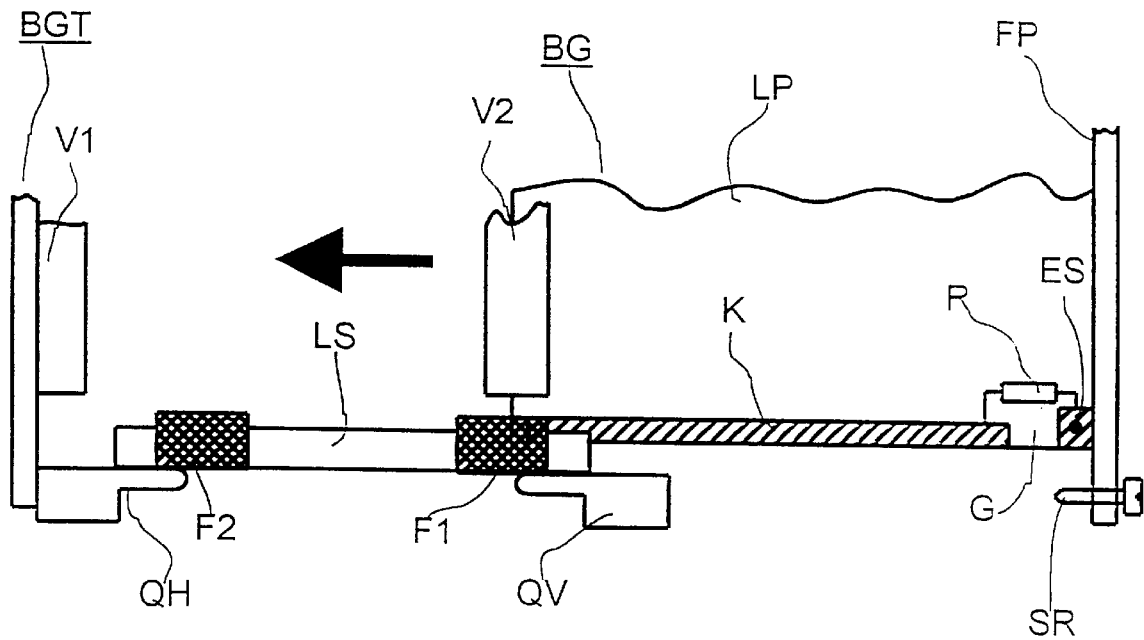
FIG. 2a shows a partial side view of an embodiment of a mounting rack according to the invention, with a resistor provided between a sliding contact and a front panel of a printed circuit board assembly.

By way of example, FIG. 2a shows a side view of a novel mounting rack BGT, together with an electrical printed circuit board assembly BG which can be inserted into it. This printed circuit board assembly BG has an electrically conductive front panel FP, which is preferably metallic, and a printed circuit board LP. It is an advantage for at least one lower guide rail LS to be fitted in the mounting rack BGT, thus assisting insertion of a printed circuit board assembly BG, by holding the edge of the printed circuit board LP and guiding it. The front panels FP of a number of printed circuit board assemblies BG inserted alongside one another in the mounting rack BGT provide an electromagnetic shield at the front of the mounting rack BGT. There is at least one strip sliding contact K on the edge of the printed circuit board LP so that a contact means F1 can make electrical contact with the printed circuit board assembly BG while it is being inserted, thus producing an electrical contact between the sliding contact K and the mounting rack BGT.

According to the invention, the sliding contact K on the printed circuit board assembly BG is not directly connected to the front panel FP. Rather, an isolation gap G is formed between the front panel FP and the sliding contact K. This isolation gap G is bridged by an electrical resistor R having an appropriately selected resistance. For example, electrostatic charges from a person touching the front panel FP are thus dissipated while the printed circuit board assembly BG is being inserted, virtually without causing any interference at all, by being discharged (damped via the resistor) to the mounting rack BGT, which is normally grounded. The resistor is advantageously connected to an electrically conductive end piece ES which forms the attachment between the front panel FP and the printed circuit board LP.

When the printed circuit board assembly BG is being inserted into the mounting rack BGT, the discharge of potentials occurs over the resistor R, over the contact strip K and over the contact means F1 for making electrical contact with the sliding contact K. In particular, a contact spring element F1 is provided for making electrical contact with the sliding contact K and can, for example, either be fitted in the region of the guide rail LS, or integrated into the guide rail LS. The sliding contact K is perferably fashioned as a conductor track on the printed circuit board LP so that, as soon as the process of inserting the printed circuit board assembly BG into the mounting rack BGT starts, the sliding contact K is gripped by the springs of the contact spring element F1, providing the electrical contact.

Another embodiment of the novel mounting rack BGT has at least one further means F2 for making electrical contact between the sliding contact K and the mounting rack BGT. This means F2 preferably has a contact spring element F2, to make contact with the sliding contact K. The contact spring element F2 is itself electrically connected to the mounting rack BGT, preferably in the region of the guide rail LS inside and at the rear of the mounting rack BGT, corresponding to the contact spring element F1. Thus, according to the invention, when the printed circuit board assembly BG is being inserted into the mounting rack BGT, an electrical connection is provided for the strip sliding contact K at least also in the rear region inside the mounting rack BGT. In this context, the term rear region means that part of the mounting rack BGT at the other end from the front panel FP when the printed circuit board assembly BG is inserted.

The additional contact, according to the invention, for the sliding contact K in the rear region of the mounting rack BGT has the particular advantage that, with the printed circuit board assembly BG inserted as illustrated in FIG. 1b, any electrostatic charges applied from the outside to, in particular, the front panel cannot penetrate deeply into the mounting rack BGT via the strip sliding contact K. Since the contact spring elements F1 and F2 allow the sliding contact K to make contact with the mounting rack BGT on at least both sides, this means, advantageously, that there are no longer any exposed regions of the strip sliding contact K to act like antennas. The invention thus prevents radio-frequency interference from being "emitted" via the sliding contact K. The contact spring elements F1 and F2 can be electrically connected to the mounting rack BGT, in particular, by being connected to respective front and rear transverse rails QV and QH, in the mounting rack BGT.

A further type of mounting rack BGT according to the invention also has means for making electrical contact between the front panel FP and the mounting rack BGT. These means are denoted by the reference symbol SR in the figures, and are preferably in the form of a screw, thus making contact once the front panel FP has been inserted.

Figure 2B:
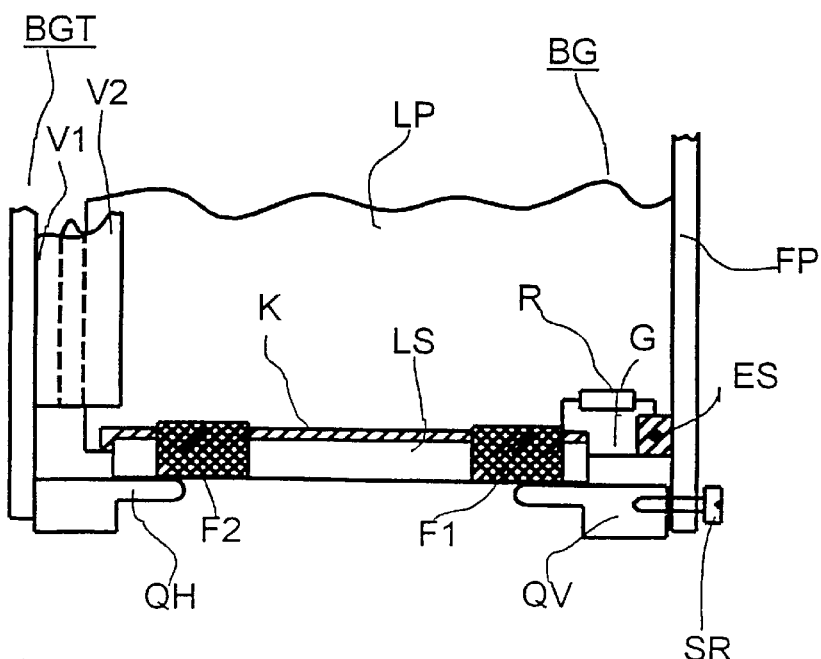
FIG. 2b shows the side view of the mounting rack from FIG. 2a, with a printed circuit board assembly completely inserted.

FIG. 2b shows the same mounting rack BGT as that in FIG. 2a, with an inserted printed circuit board assembly BG and at least one screw SR passing through the front panel FP to produce the electrical contact between the front panel FP and the mounting rack BGT. There is preferably at least one screw SR at each end of the front panel FP, top (not illustrated) and bottom, allowing the printed circuit board assembly BG to be screwed to the mounting rack BGT, particularly via a front transverse rail QV, once it has been inserted, thus making electrical contact. Another contact is thereby provided between the metallic front panel FP and the mounting rack BGT. This advantageously makes it possible for any electrostatic charge applied from the outside to the front panel FP to be dissipated, via the screw SR, directly to the mounting rack BGT, once the printed circuit board assembly has been inserted completely, thus ensuring that no charge can reach the interior of the mounting rack BGT via the contact strip K. Such a contact means SR, preferably formed as a screw, bridges the series circuit formed by the resistor R, the sliding contact K and the electrical contact means F1, F2 to the mounting rack BGT.

Figure 3A:
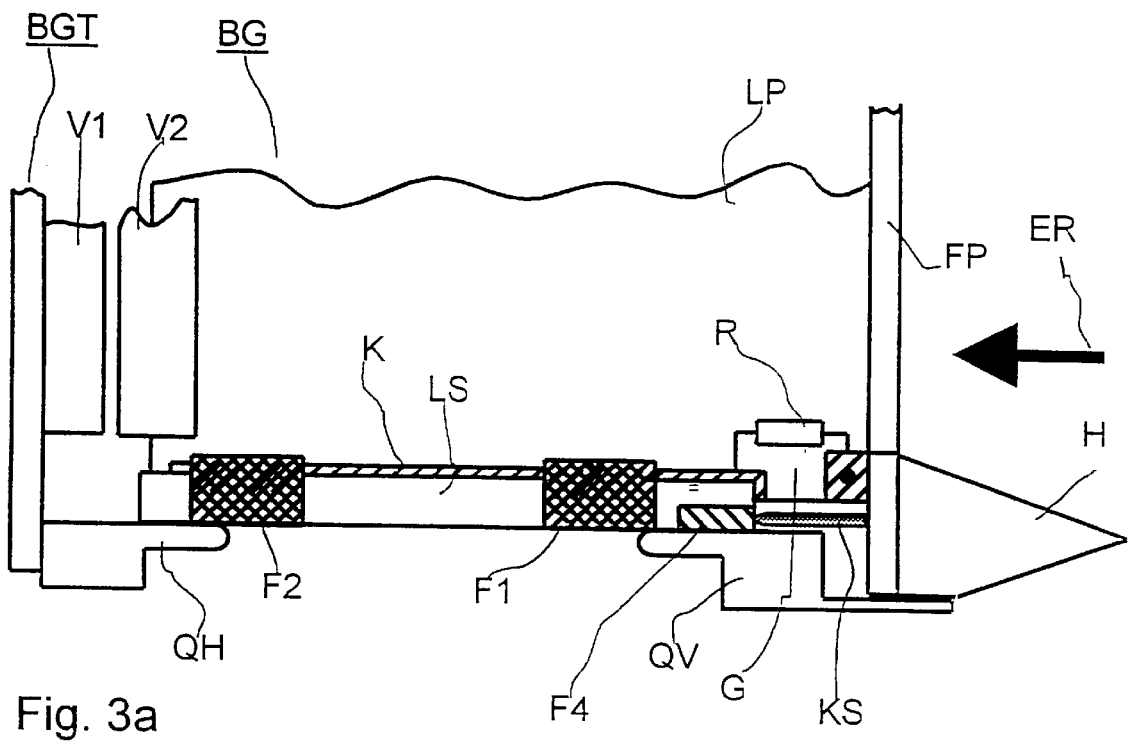
FIG. 3a shows a partial side view of another embodiment of a mounting rack according to the invention, with an additional contact pin provided on the inside of the front panel.

FIG. 3a shows another novel type of mounting rack BGT, with the front panel FP having at least one additional contact pin KS. This pin KS is preferably fitted at the bottom of the front panel, pointing into the mounting rack, in the direction ER in which the printed circuit board assembly is inserted. When the printed circuit board assembly BG is being inserted, the contact pin KS on the front panel FP makes direct electrical contact with the mounting rack BGT via another contact spring element F4. This contact spring element F4 is preferably conductively connected to the lower transverse rail QV.

This inventive design is particularly advantageous for printed circuit board assemblies BG are designed not to be screwed to the mounting rack BGT but rather, for example, to be latched to it by means of a so-called lever pulling handle H. In this case, both the contact pin KS and the contact spring element F4 are designed to be mechanically strong enough to allow a number of functions to be carried out at the same time. On the one hand, the contact pin and contact spring can act as a mechanical guide for the printed circuit board assembly during insertion, thus preventing the printed circuit board assembly from moving to one side or the other. Furthermore, once the printed circuit board assembly has been completely inserted, the two elements can be used as a so-called protective contact. This provides grounding for the front panel, complying with the German electrical requirements. There is then no need for any additional screw SR, of the type, e.g., illustrated in FIGS. 1a and 1b. Finally, the two elements can also produce a mechanical joint between the printed circuit board assembly and the mounting rack, so that no additional screw is required for fixing the components BGT and BG together.

In this case, the contact spring element F4 is preferably arranged in the front region of the mounting rack BGT, near the guide rail LS, and is electrically connected to the mounting rack BGT. The contact spring element F4 may be electrically connected to a front transverse rail QV of the mounting rack BGT, for example.

When the printed circuit board assembly BG is being inserted, the contact pin KS makes electrical contact with the contact spring element F4 before any contact is made between the connector V1 on the mounting rack BGT and the connector V2 of the printed circuit board LP in the printed circuit board assembly BG. Thus, another mechanism for discharging electrostatic charges is provided in addition to the sliding contact. Specifically, electrostatic charges on the front panel FP are further advantageously dissipated via the contact pin KS and the contact spring element F4 to the mounting rack BGT, before the assembly BG is made live by joining the connectors V1 and V2.

Figure 3B:
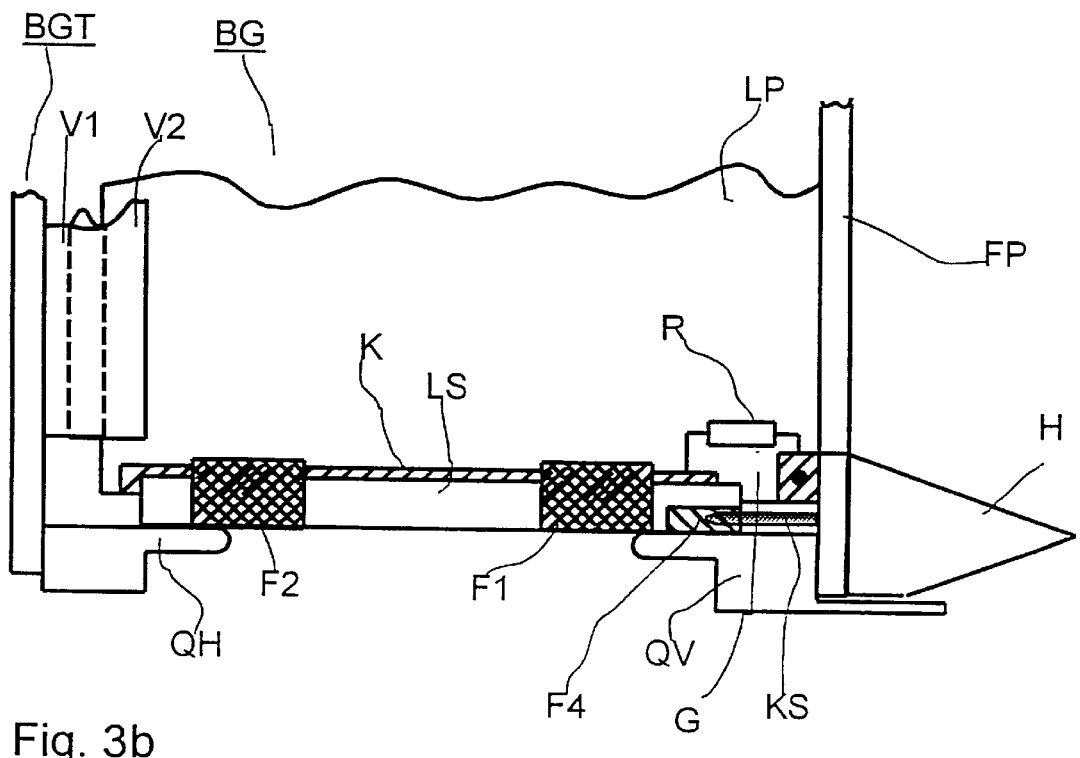
FIG. 3b shows the side view of the mounting rack from FIG. 3a, with a printed circuit board assembly completely inserted.

FIG. 3b shows the same mounting rack BGT as that in FIG. 3a, but with a printed circuit board assembly BG fully inserted. According to the invention, once the printed circuit board assembly BG has been inserted, any electrostatic charge applied, in particular, from the outside to the front panel FP is advantageously dissipated via the contact pin KS and the contact spring element F4 directly to the mounting rack BGT, thus bypassing the contact strip K and the interior of the mounting rack BGT.

One particular advantage of the novel mounting rack is that the printed circuit board assembly BG can even be inserted even while other printed circuit board assemblies in the mounting rack are still being operated, without any interference being emitted that could adversely affect operation of other printed circuit board assemblies in the mounting rack BGT.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. A mounting rack assembly, comprising:
    a) a mounting rack;
    b) at least one electrical printed circuit board assembly having an electrically conductive front panel, a printed circuit board, and at least one strip sliding contact in an edge region of said printed circuit board assembly;
    c) an electrical contact between said strip sliding contact of said printed circuit board assembly and said mounting rack, said electrical contact provided at least in a front, interior region of said mounting rack; and
    d) an electrical resistor electrically conductively connecting said front panel of said printed circuit board assembly to said strip sliding contact.

2. The mounting rack assembly as claimed in claim 1, wherein said electrical contact comprises at least one contact spring element between said strip sliding contact and said mounting rack.

3. The mounting rack assembly as claimed in claim 2, wherein:
    said mounting rack comprises at least one guide rail for supporting said electrical printed circuit board assembly; and
    said at least one contact spring element is integrated into said guide rail.

4. The mounting rack assembly as claimed in claim 1, further comprising:
    a further electrical contact between said strip sliding contact and said mounting rack, said further electrical contact provided in a rear interior region of said mounting rack.

5. The mounting rack assembly as claimed in claim 1, further comprising:
    at least one electrically conductive screw electrically and mechanically connecting said front panel and said mounting rack.

6. The mounting rack assembly as claimed in claim 1, further comprising:
    at least one electrically conductive contact pin; and
    at least one electrically conductive contact spring element mating with said conductive contact pin,
wherein said contact pin and said contact spring element electrically connect said front panel and said mounting rack.

7. The mounting rack assembly as claimed in claim 6, wherein said contact pin is arranged on said front panel, and said contact spring element is arranged on said mounting rack.

8. An electrical printed circuit board assembly, comprising:
    a) an electrically conductive front panel;
    b) a printed circuit board;
    c) at least one strip sliding contact in an edge region of said printed circuit board assembly; and
    d) an electrical resistor electrically conductively connecting said front panel to said strip sliding contact.

* * * * *